United States Patent [19]

Baker et al.

[11] Patent Number: 4,956,554

[45] Date of Patent: Sep. 11, 1990

[54] PYROELECTRIC INFRA-RED DETECTORS AND THEIR METHOD OF MANUFACTURE

[75] Inventors: Geoffrey Baker; Roger Pearce, both of Southampton; Paul L. Williamson, Shepperton, all of England

[73] Assignee: U.S. Philips Corp., New York, N.Y.

[21] Appl. No.: 302,716

[22] Filed: Jan. 26, 1989

[30] Foreign Application Priority Data

Mar. 2, 1988 [GB] United Kingdom ............... 8804959

[51] Int. Cl.$^5$ ............................................. H01L 37/00
[52] U.S. Cl. .................................................... 250/338.3
[58] Field of Search ....................................... 250/338.3

[56] References Cited

U.S. PATENT DOCUMENTS

| 3,721,628 | 3/1973 | Lock et al. ............... | 252/62.9 |
| 4,425,504 | 1/1984 | Turnbull et al. ........... | 250/353 |
| 4,727,255 | 2/1988 | Monier et al. ............. | 250/352 |

FOREIGN PATENT DOCUMENTS 57-61924 4/1982 Japan ............................ 356/43

Primary Examiner—Constantine Hannaher
Attorney, Agent, or Firm—William L. Botjer

[57] ABSTRACT

An infra-red radiation detector has a pyroelectric element (10), comprising for example TGS material, supported in spaced relationship over a heatsink body (16) for stabilizing the temperature of the element in operation with the space between opposing faces of the element (10) and body (16) containing a thermally-conductive, non-hardening and non-gaseous gel-like medium (22) such as silicon dielectric gel which thermally couples the element with the body. A small quantity of material such as solder or epoxy may be used to bond the element to the body and fix the spacing therebetween or, alternatively, the element may be supported over and bonded to the body simply by means of the medium (22) itself. Capillary action may conveniently be used to introduce the medium into the space between the element and the body.

9 Claims, 1 Drawing Sheet

PYROELECTRIC INFRA-RED DETECTORS AND THEIR METHOD OF MANUFACTURE

BACKGROUND OF THE INVENTION

This invention relates to a pyroelectric infra-red detector comprising a substantially planar pyroelectric element onto which infra-red radiation to be detected is directed, and which is supported in spaced and substantially parallel relationship over the surface of a body acting as a heat sink, the element and the body being thermally coupled. The invention relates also to a method of making such a detector.

Pyroelectric detectors are used for a variety of different purposes, for example in remote switching, and in movement sensing systems such as intruder alarms. Directing infra-red radiation to be detected onto the pyroelectric element causes a change in the temperature of the element. This temperature change generates electrical charges at the opposing electrodes which charges can be made to flow as a current through a comparatively low external impedance or to produce a voltage across the element if the external impedance is comparatively high. If the pyroelectric element is arranged as a capacitor in an amplifying circuit, the resultant current or the voltage developed can be detected. Since the pyroelectric charge is produced only while the temperature of the element is changing, it is necessary for the temperature to be varied continuously to obtain a continuous electrical signal. This may be done by chopping the incident radiation at a uniform frequency, the element being exposed to radiation at a reference temperature whilst the radiation of interest is cut off.

One application of pyroelectric detectors is in infra-red spectrometry. For such purposes, the pyroelectric element of the detector commonly comprises triglycine sulphate (TGS) as the pyroelectric material because of its suited sensitivity. Such pyroelectric detectors are preferred to other types of thermal detectors in view of their superior performance in the 10 Hz to 5kHz frequency region at which IR spectrometers are operated and their ability to respond to a wide range of wavelengths without the need for forced cooling. The pyroelectric element, which needs to be very thin for optimal performance, is mounted in an hermetically sealed envelope provided with a window overlying the element and through which radiation of the wavelength range of interest is directed onto the element.

IR spectrometers can be of the dispersive type or the Fourier transform type. These two types differ in that in the latter type the whole of the wavelength range of the incident infra-red radiation source is directed onto the detector whereas only narrow wavelength intervals are used in the former type. Consequently, in a Fourier transform spectrometer the energy received by the detector, which may be as much as 100 mW or more, could over a period of time cause the temperature of the pyroelectric element to rise gradually bearing in mind the thinness of the element. This in turn can lead to a change in output as the responsivity of the pyroelectric element, and particularly, but not exclusively, a TGS element, is not independent of operating temperature. Thermally coupling the pyroelectric element to a body acting as a heatsink is intended to minimize this problem. The combination of element and body has a shorter thermal time constant than the element alone. The hermetically-sealed envelope in which the element is mounted typically contains a gas such as dry nitrogen so that a relatively high thermal resistance exists between the element and the surrounding atmosphere. The heatsink body associated with the element has a comparatively high thermal mass, and consequently a high thermal inertia, and is designed to act as a temperature regulator and stabilize the temperature of the pyroelectric element at approximately its optimum operating point. The function of the heatsink body is thus to maintain the temperature of the pyroelectric element substantially constant in operation of the detector so that the responsivity remains much the same over a time period even though the received radiation may be high in energy.

In a known IR detector employing a thin planar TGS element, the element is bonded to a face of the heatsink body in spaced relationship by means of a centrally-disposed blob of thermally-conductive bonding material such as conductive epoxy or solder. A drop of the bonding material is placed on the face of the heatsink body and the element is then placed over the body and pushed towards the body to compress the bonding material until the opposing element and body faces are a predetermined distance apart. In its compressed state the bonding material occupies only a very small proportion of the area of the surface of the element, the remaining surface area being physically spaced from the opposing body face forming a gap between the element and the body extending around the bonding material. This gap is eventually filled by the encapsulant gas, for example nitrogen which provides a degree of thermal coupling between the element and the body. Some thermal coupling between these parts is also provided by the bonding material.

The area occupied by the bonding material is minimized in order to reduce problems arising from the physical properties of the element. Some pyroelectric materials such as TGS have anisotropic thermal expansion characteristics and if elements of these materials were to be bonded to a substrate by means of bonding material applied over too great a proportion of their surface area, this being typically around 7 square millimeters for a TGS detector element, they would tend to crack when subjected to thermal cycling.

To achieve the desired close thermal coupling, the spacing between the facing surfaces of the element and the heatsink body determined by the blob of bonding material in its compressed state needs to be very small, and would normally be less than 5 micrometers for acceptable performance of the detector when nitrogen gas is used.

Whilst such detectors have been found to work reasonably well, problems are experienced in both manufacture and use. Because the bonding material is located at only a relatively small central area of the element, it is difficult to achieve reasonable parallelism between the pyroelectric element and the face of the heatsink body. This can give rise in use to variations in temperature of the element over its area, for example at opposite edges, leading to non-uniform response. Also, the very small spacing necessary between the element and the body can lead to a high loss rate in manufacture as any dust particles or the like present in the gap may cause the element to crack when pressure is applied to the element during bonding to the body.

SUMMARY OF THE INVENTION

It is an object of the present invention to provide an improved pyroelectric infra-red detector.

According to a first aspect of the present invention, a pyroelectric infra-red detector of the kind described in the opening paragraph is characterized in that a non-hardening, thermally conductive, non-gaseous medium is present between the opposing faces of the pyroelectric element and the body.

Thermal coupling between the pyroelectric element and the body is then achieved through the non-gaseous medium. Such thermal coupling is greatly increased compared with that of the known arrangement which relies principally on a gaseous medium such as nitrogen to provide a thermal path between the element and the body.

Preferably, the medium substantially fills the space between the element and the body and extends over at least most of the available area of overlap between the body and at least the region of the pyroelectric element which is to receive incoming radiation. An improvement in thermal coupling will be found if the medium contacts only one of the opposing faces of the element and the body as the gap then existing between the other face and the medium will be relatively small, and, for example, smaller in thickness than the gap present in the known arrangement assuming comparable spacings between the element and body faces are involved. However, optimum results are achieved when the medium substantially fills the space and is in contact with both faces. Similarly, a useful improvement in thermal coupling is obtained when the medium is present over just some of the available area of overlap between the opposing faces of the element and the body, which area preferably includes at least the active region of the element, that is, the region which receives and responds to incoming IR radiation, in the case where only a part of the element provided in the detector is actually used for radiation sensing purposes, but again optimum results are achieved when at least most of that available overlap area is covered by the medium.

The medium may be a viscous fluid having a gel-like consistency. Such a material offers the advantages that it has a non-flow characteristic, that it provides cushioning to protect the element against the effects of mechanical shocks and that it readily permits expansion and contraction of the element as a result of temperature changes whilst maintaining the thermal path between the element and the body. Particularly good results have been obtained using a so-called silicone dielectric gel, such as that available from Dow Corning Corporation under their reference number 527. This resilient gel-like material exhibits advantageous cushioning and self-healing properties akin to those of a liquid but has the dimensional stability and non-flow characteristics associated more with solid elastomers. When its components are first mixed, the material has a viscous liquid form but over a period of hours it cures in situ to a gel-like consistency.

The improvement in thermal coupling provided by the invention is such that a performance superior to that of the known form of detector can readily be achieved. More importantly though, it has been found that a comparable performance is easily obtainable with a detector according to the invention in which the spacing provided between the element and body is considerably greater than that needed for optimum performance of the known form of detector. Accordingly, the problem of manufacturing losses due to the smallness of the spacing necessary in the known detector can be avoided to a large extent by using greater spacings without having to suffer a degradation in operational characteristics. For example, an embodiment of the invention using silicone dielectric gel as the thermally conducting medium and a spacing between the element and the body of around 20 to 30 micrometers has been found to exhibit a performance at least equivalent to that obtained from the known form of detector with a spacing of less than 5 micrometers between the element and the body.

Moreover, it has been found that the effects caused by the element not being precisely parallel with the opposing face of the body become less significant, as regards uniformity of response by the element, when greater spacings are used, so that small deviations from parallelism can be tolerated.

An additional advantage of the present invention is that because of the improved thermal coupling obtained between the element and the heatsink body, the detector is capable of handling much higher power levels of incoming radiation than the known detector.

The amount of thermal coupling obtained can easily be controlled and tailored to meet the requirements of individual detectors by the choice of spacing between the element and the body.

The heatsink body preferably comprises alumina, although other suitable materials such as silicon may be used instead.

In one embodiment of the invention, the pyroelectric element is bonded to and maintained spaced from the body by means of solid bonding material disposed between the opposing faces of the element and body and occupying a relatively small area of the element face, in a manner similar to that used in the known arrangement. The bonding material may be epoxy or solder. In this case, the thermally conductive medium is present in the remaining available area of overlap between the element and the body, and the element is maintained in predetermined spatial relationship with the body primarily by the bonding material.

In another embodiment, the pyroelectric element is bonded to, and supported in predetermined spatial relationship with, the body by means of the thermally conductive medium itself. Thus separate bonding material is not used and instead reliance for support of the element and the bonding and spacing between the element and the body is placed on the physical properties of the medium. This arrangement offers simplicity of construction. Moreover a greater degree of cushioning to the element is obtained through its avoidance of a solid bond.

Whilst the invention is especially beneficial to detectors employing TGS pyroelectric elements, it is applicable also to detectors using other kinds of pyroelectric elements, for example, lithium tantalate, strontium barium niobate and PZT based elements.

According to a further aspect of the present invention there is provided a method of manufacturing a pyroelectric infra-red detector in accordance with the first aspect of the present invention and which includes the step of positioning the pyroelectric element over the heatsink body in predetermined spaced relationship, which is characterized in that the thermally-conductive medium is thereafter introduced into the space between the element and the body through capillary action. In using capillary action in this manner manufacture of the detector is greatly simplified, it being necessary simply to supply the medium to the edge of the gap between the element and the body.

BRIEF DESCRIPTION OF THE DRAWINGS

Embodiments of pyroelectric infra-red detectors, and methods for their manufacture, in accordance with the invention will now be described, by way of example, with reference to the accompanying drawings, in which.

For the sake of clarity, the Figures are not drawn to scale.

DETAILED DESCRIPTION OF THE PREFERRED EMBODIMENTS

Figure 1:
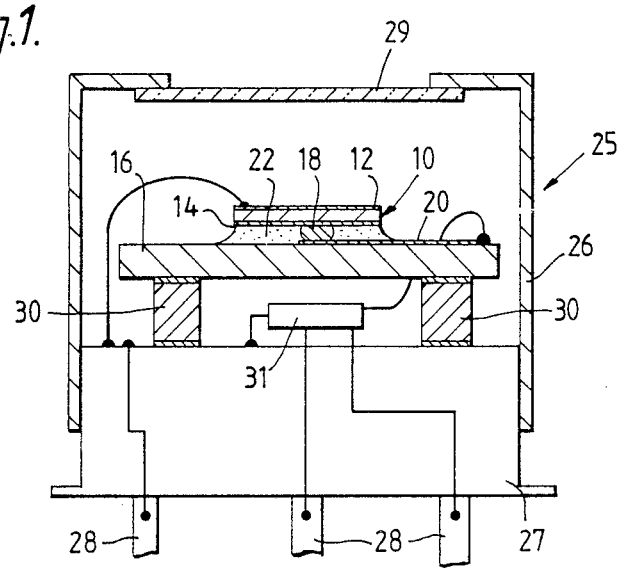
FIG. 1 is a partly schematic cross-sectional view of one embodiment of a pyroelectric infra-red detector in accordance with the invention.

The embodiment of pyroelectric infra-red detector shown in FIG. 1 comprises a pyroelectric element 10 formed from a body of TGS (triglycine sulphate) pyroelectric crystalline material. More particularly, the pyroelectric material comprises deuterated L-alanine-doped triglycine sulphate (DLATGS), as described for in British Patent Specification GB 1297198 which corresponds to U.S. Pat. No. 3,721,628 to which reference is invited. The element 10 comprises a planar disc-shaped slice of this material of around 3 mm in diameter and 5 to 20 micrometers in thickness. The element 10 is provided with electrodes on its major surfaces comprising evaporated metallic layers. The upper electrode 12 onto which infra-red radiation to be detected is directed may comprise a NiCr layer over which a gold black layer is deposited to improve radiation absorption characteristics. The lower electrode 14 comprises a gold layer. The electrodes 12 and 14 may cover only a portion of the upper and lower surfaces respectively of the pyroelectric material thus defining an effective active region of the element onto which radiation to be detected is confined. However, as shown in FIG. 1, and likewise in the embodiment of FIG. 2, the electrodes 12 and 14 in this embodiment cover completely the area of the pyroelectric material and radiation to be detected is directed over all this area so that the entire area of the element is active. Other suitable electrode materials may be used as will be apparent to persons skilled in the art.

The pyroelectric element is bonded to, and supported by, a comparatively large thermally conductive body 16. The body 16 is cylindrical with a flat upper surface and the element 10 is arranged substantially parallel to and coaxially with this body in spaced relationship. The spacing between the opposing flat faces of the element 10 and the body 16 is predetermined and fixed by a small blob of solid bonding material 18 arranged centrally and occupying a relatively small portion of the area of overlap between the element 10 and the body 16. The bonding material comprises an electrically and thermally conductive material such as solder or a suitable epoxy.

The body 16 comprises alumina and includes an electrically conductive track 20 formed on its upper surface which extends radially from adjacent its periphery to an enlarged termination centrally of the body and underlying the bonding material 18 so that electrical connection is established between the track 20 and the lower electrode 14 of the pyroelectric element via the bonding material 18.

The pyroelectric element 10 and the body 16 are contained in an hermetically sealed envelope 25 which may for example have a generally conventional T05 outline. The envelope 25 comprises a cylindrical metallic canister 26 secured to the rim of a metallic base 27 provided with electrical leadthrough pins 28. The canister 26 has a centrally disposed circular opening in its top wall over which is secured a window of a material suitable for allowing the infra-red wavelength range of interest to pass therethrough and impinge upon the upper electrode 12 of the element 10. By way of example, the detector may be required to detect radiation of wavelengths ranging from approximately 2 to 50 micrometers or higher and in this case the window comprises caesium iodide. For longer wavelengths polythene may be used for the window. The envelope 25 may be evacuated or it may be filled with a gas such as dry nitrogen which is relatively inert with respect to internal component parts.

The body 16 is maintained in spaced, substantially parallel, relation with the base 27 by a plurality of pillars 30, two of which are shown in FIG. 1, formed for example, of metal or alumina. The ends of the pillars 30 are secured to the underside of the body 16 and the base 27 respectively by adhesive. Besides positioning the element 10 closer to the window 29 and providing thermal coupling between the body 16 and the base 27, the pillars serve also to define a space beneath the body 16 in which detector circuitry is located. This circuitry is indicated schematically at 31 and follows a conventional form such as an FET and high value resistor and/or a non-linear element kind of circuit as is known to persons skilled in the art. Electrical connection from the upper electrode 12 and the conductive track 20 to the circuit 31 is established by wires in usual manner.

The body 16 has a high thermal inertia and is intended to act as a heatsink to shorten the thermal time constant of the combination of the pyroelectric element 10 and the body 16 and maintain the element at a substantially constant temperature during normal operation of the detector thereby stabilizing responsivity. To this end, the pyroelectric element 10 is coupled thermally to the body 16. Some thermal coupling is provided through the bonding material 18. Further thermal coupling is obtained, however, by providing, in accordance with the invention, a thermally conductive, non-hardening and non-gaseous medium, indicated at 22 in FIG. 1, within the space between the opposing faces of the element 10 and the body 16. In this embodiment, the medium 22 comprises a silicone dielectric gel such as that available as a two component mix from Dow Corning Corporation under their reference number 527 and, as shown in FIG. 1, substantially completely fills the available gap between the element 10 and the body 16 around the bonding material 18. If only a portion of the element 10 is to receive radiation with the electrodes configured to define this active region accordingly, then the medium need only cover the available part of the area of overlap between this active region and the body 16. The spacing between the opposing faces of the element 10 and the body 16 is between approximately 20 to 30 micrometers.

By virtue of the provision of the medium 22 and the thermal coupling obtained thereby, the spacing between the opposing faces of the element 10 and the body 16 is thus increased significantly compared with the size of gap needed to provide sufficient thermal coupling in the aforementioned known detector arrangement where the space between the element and body is left free and filled with a gaseous medium such as nitrogen. In this respect it has been demonstrated that the performance provided by the detector with a spacing between the element and body of around 20 micrometers which is filled with silicon dielectric gel is at least equivalent to that obtainable from the known form of detector using a spacing of less than 5 micrometers and containing dry nitrogen gas. The increased spacing permitted by the invention simplifies manufacture and leads to higher yields as the risk of cracking of the element 10 when being mounted on the body 11 due to dust particles trapped in the intervening space is removed. Moreover, the need for parallelism between the element and body faces to ensure uniformity of response becomes less critical as the spacing increases.

In manufacture of the embodiment shown in FIG. 1, the element 10 and the body 16 are assembled by disposing a small quantity of the bonding material 18 in the form of a ball of solder, on the body 16 and then placing the element 10 over this material. Pressure is applied to the element 10 urging it towards the body 16, whilst being held substantially parallel, and squashing the bonding material to a generally disc-shaped form to achieve pressure bonding and the required spacing between the element 10 and the body 16. In this final, squashed form, the bonding material has an average diameter typically around 300 micrometers and so occupies only a small part of the surface area of the element. Alternatively a drop of conductive epoxy may be used as the bonding material. This again is squashed to a similar size by applying pressure to the element and then allowed to set, thus fixing the spacing.

Thereafter the silicone gel medium 22 is introduced into the gap between the element 10 and body 16 surrounding the bonding material 18. This is achieved in a convenient and simple manner by applying the medium in its initial viscous liquid state, which follows mixing of its component parts according to the manufacturers instructions, to the edge of the gap and permitting the medium to be drawn into, and fill, the gap under capillary action. The assembly is then left to allow the medium to cure to a gel-like consistency, which normally takes a few hours. The cured medium 22 has cushioning, self-healing and resilient properties similar to those of a liquid whilst also exhibiting dimensional stability and non-flow characteristics similar to those of a solid elastomer. Because of its properties, the medium 22 also assists in bonding the element 10 to the body 16.

Figure 2:
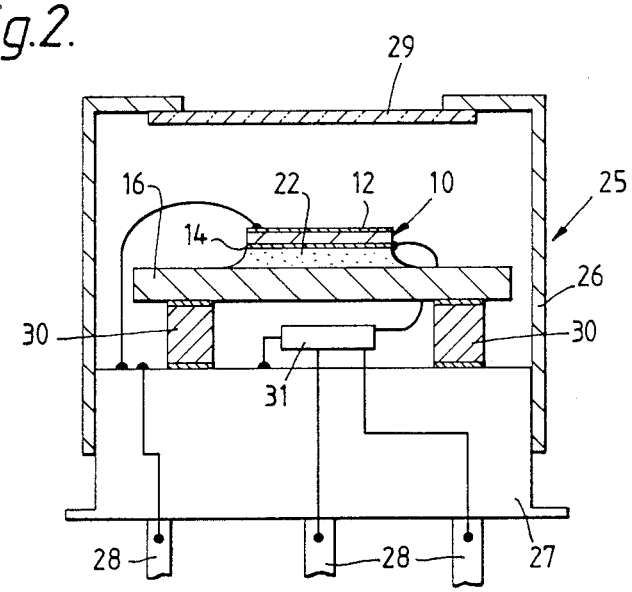
FIG. 2 is a similar partly schematic cross-sectional view of a further embodiment of a pyroelectric infra-red detector in accordance with the invention.

Referring now to FIG. 2, the embodiment of detector shown is identical in many respects to that described previously with corresponding components accordingly being designated with the same reference numerals. This embodiment differs from the previous embodiment in that the bonding material 18 is absent and the pyroelectric element 10 is supported over and held on the body 16 using the medium 22 as the sole bonding and supporting agent. The spacing between the opposing faces of the element 10 and the body 18 is in this case determined by the medium 22 alone. The medium 22 therefore serves to cushion the element 10 in the event of the detector being subjected to mechanical shocks and the like and provides the sole means of thermal coupling between the element 10 and the body 16. Some support to the element 10 may also be afforded by the connecting wire attached to the upper electrode 12 although this generally will be insignificant.

Silicone dielectric gel is again used for the medium 22, this material offering the kind of properties needed to support the element in substantially predetermined spatial relationship with the body 16 and to bond the element to the body.

Because conductive bridging material between the element and the body is not used, electrical connection with the lower electrode 14 has to be provided in a different manner. This may be accomplished by omitting the track 20 and connecting a wire directly between the lower electrode 14 and the circuitry 31, or alternatively to a conductive pad formed on the body 16 which, in turn is connected to the circuit 31 by a further wire as described previously.

It will be appreciated that the behavior and performance of the detector is generally very similar to that described previously.

Manufacture of this embodiment of detector differs slightly in that the pyroelectric element 10 and the body 16 are assembled by holding the element 10 over the body 16 substantially parallel thereto and at the required spacing of around, for example, 20 to 30 micrometers using any suitable temporary support. The medium 22 is then applied in its viscous liquid form obtained upon initial mixing of its constituents to the edge of the gap between the element 10 and the body 16 and is drawn into the gap under capillary action to fill the gap. The medium is allowed to cure to its gel-like consistency and then the temporary support for the element is removed leaving the element attached to the body 16 via the medium 22.

The properties of the silicone gel are such that it readily supports the element in its predetermined spatial relationship with the body 16. The silicone gel also exhibits a semi-permanent and reformable adhesive bonding characteristic upon curing ensuring that the element remains bonded to the body 16.

Whilst in the above embodiments, the use of silicone dielectric gel as the medium 22 has been described in particular, it is envisaged that other thermally-conductive, non-hardening and non-gaseous media having the desired properties may be employed instead.

Moreover, it will be appreciated that the invention is applicable to detectors using elements of pyroelectric material other than TGS.

We claim:

1. A pyroelectric infra-red detector comprising a substantially planar pyroelectric element onto which infra-red radiation to be detected is directed, and which is supported in spaced and substantially parallel relationship over the surface of a body acting as a heat sink, the element and the body being thermally coupled, characterized in that a non-hardening, thermally conductive, non-gaseous medium is present between the opposing faces of the pyroelectric element and the body.

2. A pyroelectric infra-red detector according to claim 1, characterized in that the medium substantially fills the space between the element and the body and extends over at least most of the available area of overlap between the body and at least the region of the element which is to receive incoming radiation.

3. A pyroelectric infra-red detector according to claim 1, characterized in that the medium comprises a viscous fluid having a gel-like consistency.

4. A pyroelectric infra-red detector according to claim 3, characterized in that the medium comprises a silicone dielectric gel.

5. A pyroelectric infra-red detector according to claim 1, characterized in that the body comprises alumina.

6. A pyroelectric infra-red detector according to claim 1, characterized in that the pyroelectric element is bonded to and maintained spaced from the body by means of solid bonding material disposed between the opposing faces of the element and the body and occupying a relatively small area of the face of the element.

7. A pyroelectric infra-red detector according to claim 1, characterized in that the pyroelectric element is bonded to, and supported in predetermined spatial relationship with the body by means of the thermally conductive medium.

8. A pyroelectric infra-red detector according to claim 1, characterized in that the spacing between the element and the body is between approximately 20 and 30 micrometers.

9. A method of manufacturing a pyroelectric infra-red detector having a substantially planar pyroelectric element onto which infra-red radiation to be detected is directed and which is supported in space and substantially parallel relationship over the surface of a body acting as a heat sink, the method comprising positioning the pyroelectric element over the body in a predetermined spaced relationship and introducing a thermally conductive medium into the space between the element and the body through capillary action.

* * * * *